(12) United States Patent
Karthaus

(10) Patent No.: US 9,024,687 B2
(45) Date of Patent: May 5, 2015

(54) METHOD AND CIRCUIT FOR DRIVING A SWITCH-MODE AMPLIFIER ARRAY

(71) Applicant: Udo Karthaus, Neu-Ulm (DE)

(72) Inventor: Udo Karthaus, Neu-Ulm (DE)

(73) Assignee: Udo Karthaus, Neu-Ulm (DE)

( * ) Notice: Subject to any disclaimer, the term of this patent is extended or adjusted under 35 U.S.C. 154(b) by 99 days.

(21) Appl. No.: 13/889,387

(22) Filed: May 8, 2013

(65) Prior Publication Data

US 2014/0333375 A1    Nov. 13, 2014

(51) Int. Cl.
H03F 3/68    (2006.01)
H03F 1/02    (2006.01)
H03F 1/32    (2006.01)
H03F 3/217   (2006.01)

(52) U.S. Cl.
CPC ............... *H03F 1/0294* (2013.01); *H03F 3/68* (2013.01); *H03F 1/32* (2013.01); *H03F 3/2178* (2013.01)

(58) Field of Classification Search
CPC ........................................................ H03F 3/68
USPC ..................................... 330/10, 124 R, 207 A
See application file for complete search history.

(56) References Cited

U.S. PATENT DOCUMENTS 6,674,789 B1 *   1/2004   Fardoun et al. ................ 375/132
6,836,183 B2 *  12/2004   Wight ......................... 330/124 R
8,026,763 B2 *   9/2011   Dawson et al. ............. 330/124 R

* cited by examiner

*Primary Examiner* — Steven J Mottola

(57) ABSTRACT

A circuit arrangement for generating the drive signals for at least three radio frequency switch-mode amplifiers is described. The circuit arrangement comprises at least two switch-mode amplifiers performing RF out-phasing, and at low RF power level, the average switching frequency—averaged over time and over all switch-mode amplifiers—is less than the radio frequency.

7 Claims, 5 Drawing Sheets

METHOD AND CIRCUIT FOR DRIVING A SWITCH-MODE AMPLIFIER ARRAY

SUMMARY OF THE INVENTION

The invention relates to a modulation scheme for a plurality of switch-mode power amplifiers. It also relates to the modulator using the modulation scheme. It also relates to an array of switch-mode amplifiers being modulated according to the modulation scheme.

CROSS REFERENCE TO RELATED APPLICATIONS

This application is related to U.S. patent application Ser. No. 13/889,383, "Circuit arrangement for generating a radio frequency signal", filed today, May 8, 2013. The entire contents of the foregoing application are incorporated herein by reference.

BACKGROUND OF THE INVENTION

It is a general requirement to design a radio frequency power amplifier such that the radio frequency power amplifier is reasonably linear, is highly efficient and is substantially insensitive to load impedance variation and component variation or mismatching load impedances. Power efficiency, for example, expressed as the ratio of delivered RF signal power (Pout) Dc input power consumed. Power amplifiers are needed at both ends of cellular and other wireless communication: At the base station and at the mobile terminal. Base stations typically need to process signals of multiple users. Therefore the total RF signal they need to transmit—even when applying Crest factor reduction techniques—typically exhibits a peak to average power ratio (PAPR, or Crest factor) of 7-10 dB. This means that the average output power is 5 to 10 times lower than the peak instantaneous power. With modern communication standards, such as WiFi or LTE, even the mobile terminal suffers from high PAPR. Conventional power amplifiers like class-A, class-AB etc. are quite inefficient for high PAPR signals. For cellular base-stations, a more efficient architecture is the Doherty amplifier. However, this architecture is narrowband, and very sensitive to variations in load impedance. Another architecture is the class-S amplifier, a switch-mode amplifier driven with a band-pass delta-sigma modulated quasi-digital signal. In theory, this amplifier can reach 100% efficiency. In practice, due to parasitic capacitances and resistances of real transistors, it is not very efficient, and inter symbol interference distorts the output spectrum.

A cleaner spectrum which is less sensitive to inter-symbol interference is provided by the RF out-phasing amplifier. However, efficiency is only moderate for high PAPR signals, because switching frequency and switching loss do not reduce at reduced (backed-off) instantaneous output power.

It would be desirable to provide an RF power amplifier which can at the same time provide high power efficiency and a reasonably clean spectrum (low ACLR) in presence of high PAPR signals.

It would further be desirable to provide an RF power amplifier that is not very sensitive to variations in load impedance.

SUMMARY OF THE INVENTION

These and other objects are solved by a circuit arrangement for generating the drive signals for at least three radio frequency switch-mode amplifiers, wherein at least two switch-mode amplifiers perform RF out-phasing, and wherein at low RF power level, the average switching frequency—averaged over time and over all switch-mode amplifiers—is less than the radio frequency.

The present disclosure therefore teaches a circuit arrangement and a method that applies RF out-phasing to at least two switch-mode amplifiers, and that disables one or more switch-mode amplifiers temporarily at lower power levels. Switch-mode amplifiers may dynamically be added depending on the instantaneously required RF output power.

In one aspect of the present disclosure, the circuit arrangement further comprises a timing unit based on a DLL, a ring-oscillator, a plurality of analog PLLs or a plurality of digital PLLs.

In another aspect of the present disclosure, switch-mode amplifiers are organized in pairs, and are dynamically added in pairs depending on the instantaneously required RF output power.

In yet another aspect of the disclosure, switching events are dynamically mapped to switch-mode amplifiers.

The present disclosure also teaches a circuit arrangement of at three least switch-mode amplifiers, wherein RF out-phasing is applied to at least two switch-mode amplifiers, and wherein one or more switch-mode amplifiers are temporarily disabled at lower power levels.

In different aspects of the disclosure, power combing of the output power of the at least three switch-mode amplifiers is done either by transformers, or by "on the air" combining, or by a combiner circuit that comprises at least one shunt capacitor, at least one series inductive circuit element per switch-mode amplifier, connected between the switch-mode amplifier's output and the shunt capacitor. "On the air" combining means connecting separate radiating elements such as antennas to separate switch-mode amplifiers, so that the output power is not combined inside the circuit arrangement itself, but on the air.

The present disclosure also teaches a circuit arrangement comprising a signal analyzer configured to determine an instantaneous power level or amplitude level of an input signal to be amplified, wherein the determined instantaneous power level or amplitude level determines an instantaneous number of switch-mode amplifiers to be used for jointly amplifying the input signal; a pulse generator configured to generate drive pulses according to an out-phasing modulation scheme for the determined instantaneous number of switch-mode amplifiers selected from at least three switch-mode amplifiers.

In one aspect of the disclosure, the pulse generator is further configured to select the switch-mode amplifiers for the instantaneous out-phasing modulation scheme on the basis of at least one of a random selection scheme, a periodic selection scheme, a round-robin selection scheme, and an alternating selection scheme.

In one aspect of the disclosure, the total number of switch-mode amplifiers is an even number and at least four. In this aspect, the switch-mode amplifiers are organized as pairs. At least one pair, when selected by the pulse generator, is temporarily driven by the drive pulses according to the out-phasing modulation scheme; and the pulse generator is further configured to generate the drive pulses for the pairs of switch-mode amplifiers.

The present disclosure also teaches a method for controlling at least three switch-mode amplifiers for jointly amplifying an input signal. This method comprises determining an instantaneous power level or amplitude level of an input signal to be amplified, wherein the determined instantaneous power level or amplitude level determines an instantaneous number of switch-mode amplifiers to be used for jointly amplifying the input signal; and generating the drive pulses according to an out-phasing modulation scheme for the determined instantaneous number of switch-mode amplifiers selected from at least three switch-mode amplifiers.

These and other aspects of the invention will be apparent from and elucidated with reference to the embodiment(s) described hereinafter.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
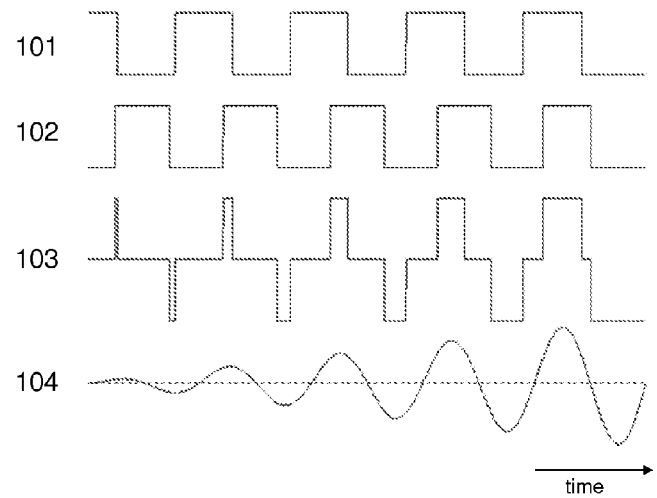
FIG. 1 shows a prior art out-phasing modulation scheme.

FIG. 1 shows a prior art radio frequency out-phasing modulation scheme. 104 is the desired radio frequency transmit signal. The scheme requires two switch-mode amplifiers. Their output signals 101 and 102 are in phase for maximum RF output signal, and out of phase for reduced RF output signal 104. Individual output signals 101 and 102 are combined to obtain a sum signal 103. This signal exhibits short pulses at low power levels and longer pulses at higher output power levels. The final RF output signal 104 can be obtained from the sum signal 103 by band-pass filtering. The unavoidable group delay of this filtering is not shown in FIG. 1.

Figure 2:
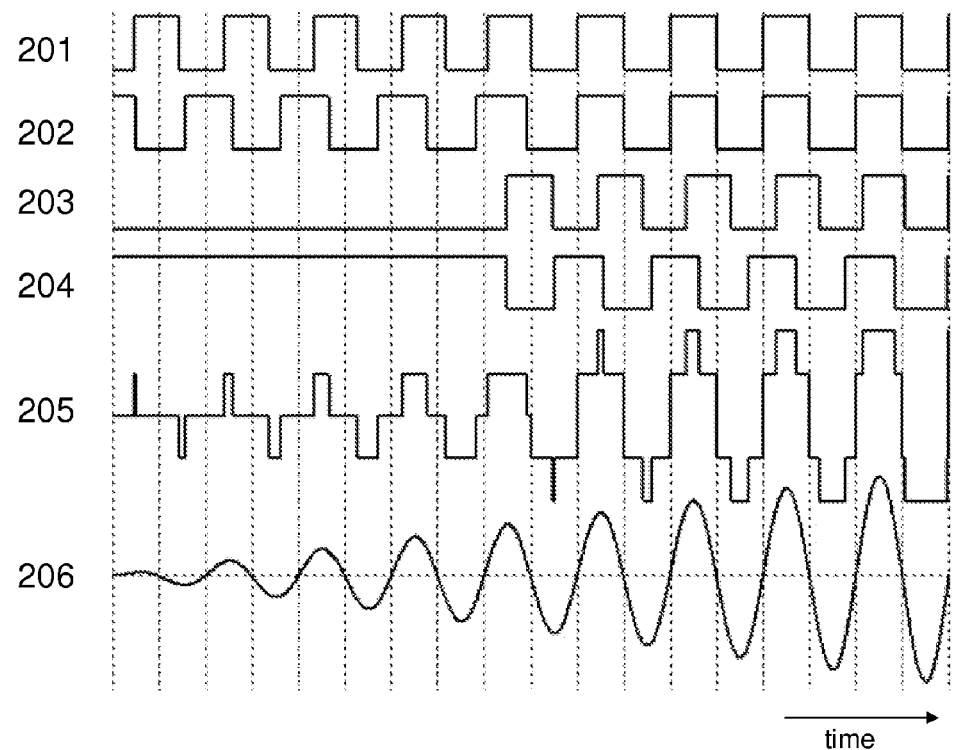
FIG. 2 shows a modulation scheme according to one aspect of the disclosure.

FIG. 2 shows a modulation scheme according to one aspect of the disclosure. In this embodiment, an even number of switch-mode amplifiers is used. In the specific example of FIG. 2, the number of switch-mode amplifiers is four, or, equivalently, there are two pairs of switch-mode amplifiers. The output signals of the first pair of switch-mode amplifiers 201 and 202, and the output signals of the second pair of switch-mode amplifiers 203 and 204, are combined to obtain a sum signal 205. At low power levels, only the first pair of switch-mode amplifiers is active. The sum signal 205 exhibits pulses with increasing length for increasing RF output power. At higher output power levels, the second pair of switch-mode amplifiers becomes active, too, and also performs RF out-phasing. The peak to peak amplitude of the sum signal 205 is larger compared to the case where the second pair of switch-mode amplifiers is not active. The final RF output signal 206 can be obtained from the sum signal 205 by band-pass filtering. The unavoidable group delay of this filtering is not shown in FIG. 2. In the example of FIG. 2, the threshold from low power levels with 2 amplifiers being active to high power levels with 4 amplifiers being active is chosen to be 6 dB below peak output power, or equivalently at 50% of the amplitude corresponding to peak output power. This threshold of −6 dB is a non-limiting example. There may be more than one threshold, and thresholds may be at substantially higher or lower power levels than 6 dB below peak power. In FIG. 2, the average switching frequency at low power levels—averaged over time and over all switch-mode amplifiers—is half the radio frequency, as two amplifiers are switching at the radio frequency, and two amplifiers are off.

Figure 3:
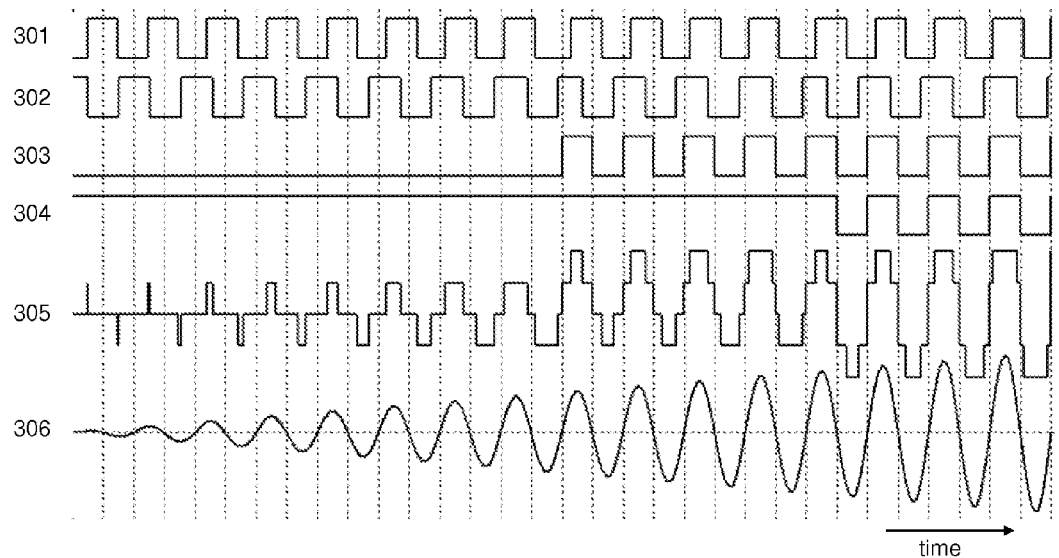
FIG. 3 shows a modulation scheme according to another aspect of the disclosure.

FIG. 3 shows a modulation scheme according to another aspect of the disclosure. In this embodiment, the number of switch-mode amplifiers can be any number greater than two. In the specific example of FIG. 3, the number of switch-mode amplifiers is four. The output signals of all four switch-mode amplifiers 301, 302, 303 and 304 are combined to obtain a sum signal 305. At low power levels, only the first and the second switch-mode amplifiers are active. The sum signal 305 exhibits pulses with increasing length for increasing RF output power. At even higher output power levels, the third switch-mode amplifier becomes active, too, and finally, at even higher power levels, the fourth switch-mode amplifier also becomes active. At any power level range, at least two of the four switch-mode amplifiers perform RF out-phasing. With each additional switch-mode amplifier becoming active, the peak to peak amplitude of the sum signal 305 increases. The final RF output signal 306 can be obtained from the sum signal 305 by band-pass filtering. The unavoidable group delay of this filtering is not shown in FIG. 3. In the example of FIG. 3, the threshold from low power levels with 3 amplifiers being active to high power levels with 4 amplifiers being active is chosen to be 2.5 dB below peak output power, or equivalently at 75% of the amplitude corresponding to peak output power. In FIG. 3, the average switching frequency at power levels between 6 dB and 2.5 dB below peak output power—averaged over time and over all switch-mode amplifiers—is 75% of the radio frequency, as three amplifiers are switching at the radio frequency, and one amplifier is off. At even lower power levels, average switching frequency in FIG. 3 is 50% of the radio frequency.

Figure 4:
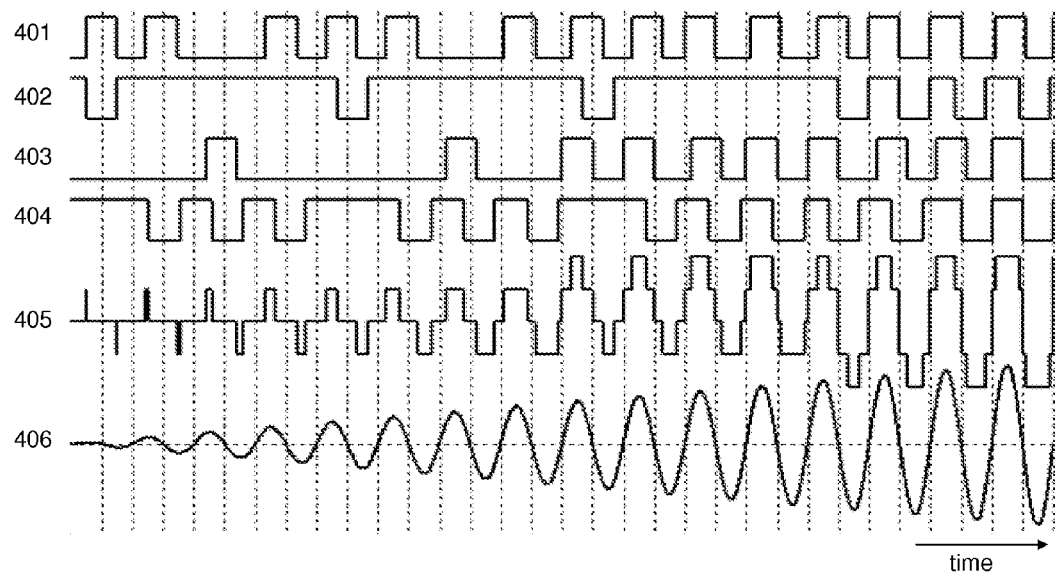
FIG. 4 shows a modulation scheme according to yet another aspect of the disclosure.

FIG. 4 shows a modulation scheme according to yet another aspect of the disclosure. It is essentially equivalent to the modulation scheme of FIG. 3. Especially the sum signal 405 is identical to the sum signal 305 of FIG. 3, and the filtered RF signal 406 is identical to the filtered RF signal 306 of FIG. 3. The new aspect of FIG. 4 is the dynamic mapping of pulses to switch-mode amplifiers. It is seen that some pulses originally apparent at the first output signal 301 in FIG. 3 are now mapped to the third output signal 403 in FIG. 4, and vice versa. Also, it is seen that some pulses originally apparent at the second output signal 302 in FIG. 3 are now mapped to the fourth output signal 404 in FIG. 4, and vice versa. In FIG. 4, this mapping is done randomly, but deterministic mapping patterns are also possible. Deterministic patterns could be periodic mapping patterns or delta-sigma based mapping patterns. One advantage of dynamic mapping is, that non-linearity caused by mismatch between switch-mode amplifier paths can be noise shaped, so that unwanted signals caused by such mismatch appear mainly outside the RF frequency band of interest. Anther advantage may be that the mean voltages of all switch-mode amplifiers can be kept equal. In this case, the series coupling capacitors 914, 924, 934 and 944 of FIG. 5 may not be needed. Another advantage may be that the power dissipation may be more evenly distributed over the switch-mode amplifiers, making the arrangement less sensitive to thermal issues. Another advantage may be the avoidance or reduction of memory effects, as all switch-mode amplifiers are used at all power levels, and long idle times of some switch-mode amplifiers are avoided. Unlike FIG. 2 and FIG. 3, in FIG. 4 all switch-mode amplifiers are active at all power levels, however, at reduced average switching frequency due to the dynamic mapping. Exactly as in FIG. 3, the average switching frequency at power levels between 6 dB and 2.5 dB below peak output power—averaged over time and over all switch-mode amplifiers—is 75% of the radio frequency. The average switching frequency is not affected by the dynamic mapping shown in FIG. 4. Also, exactly as in FIG. 3, at even lower power levels, average switching frequency is 50% of the radio frequency.

Figure 5:
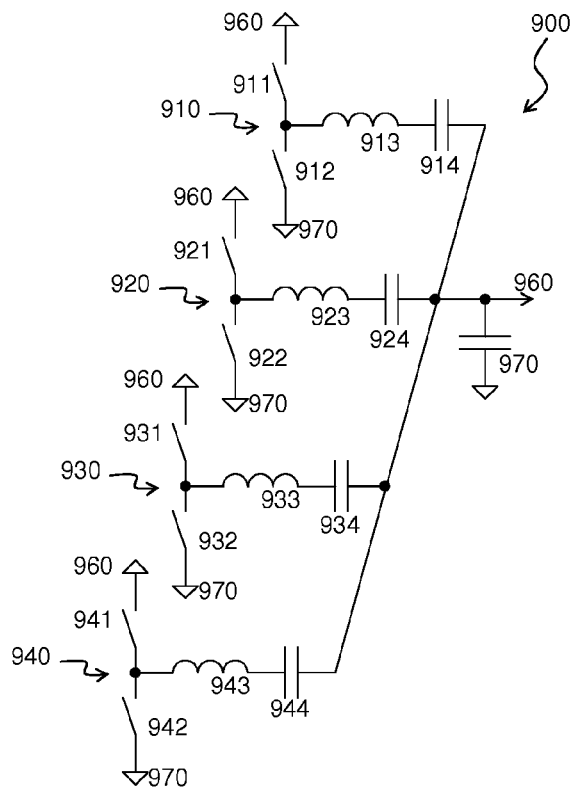
FIG. 5 shows a schematic diagram of a load modulating power combiner according to one aspect of the disclosure.

FIG. 5 shows a schematic diagram of a load modulating power combiner according to one aspect of the disclosure. In this aspect of the invention, the output power of switch-mode amplifiers 910, 920, 930 and 940 is combined by series inductive circuit elements 913, 923, 933, 943, and at least one shunt capacitive circuit element 970 to obtain the combined output signal 960. AC coupling capacitors 914, 924, 934, 944 may be required to prevent undesired directional currents through switches 911, 912, 921, 922, 931, 932, 941 and/or 942 of the switch-mode amplifiers, and through series inductors 913, 923, 933 and/or 943.

Figure 6:
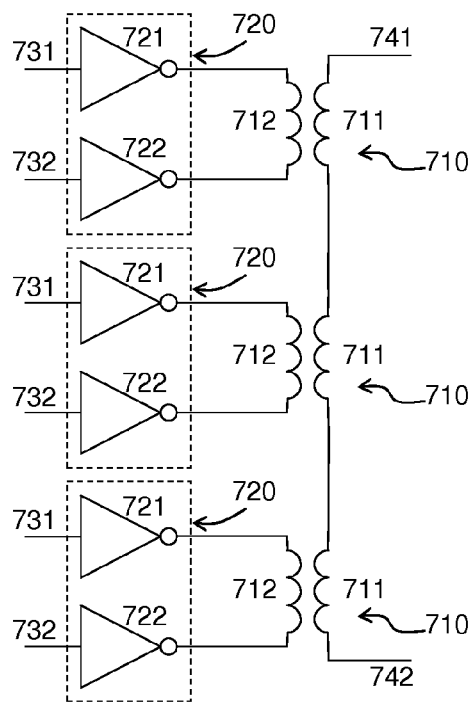
FIG. 6 shows a schematic diagram of a load modulating power combiner according to another aspect of the disclosure.

FIG. 6 shows a schematic diagram of a load modulating power combiner according to another aspect of the disclosure. In this specific example, the power of six switch-mode amplifiers or, equivalently, of three pairs of switch-mode amplifiers is shown, but the concept can be applied to any number of switch-mode amplifiers. Also uneven numbers of switch-mode amplifiers can be supported if the primary sides of transformers 710 are terminated with low RF impedance. Each switch-mode amplifier 721 and 722 or pair of switch-mode amplifiers 720 drives the primary side 712 of one transformer 710. The secondary sides 711 of transformers 710 are connected in series in order to create the sum signal between nodes 741 and 742. These two nosed can be used as one differential output. Alternatively, if one of the two output nodes 741 or 742 is terminated with low RF impedance, the other output can be used as single-ended output. In this case, the configuration of FIG. 6 can also perform differential to single-ended conversion. FIGS. 5 and 6 show half-bridge amplifiers comprising a high-side switch and a low-side switch as an example for switch-mode amplifiers. Many other types of switch-mode amplifiers are also possible and covered by this disclosure, as for example class-D and inverse-class-D amplifiers, emitter coupled logic (ECL), source coupled logic (SCL) or current mode logic (CML) cells, and full-bridge or H-bridge amplifiers.

Figure 7:
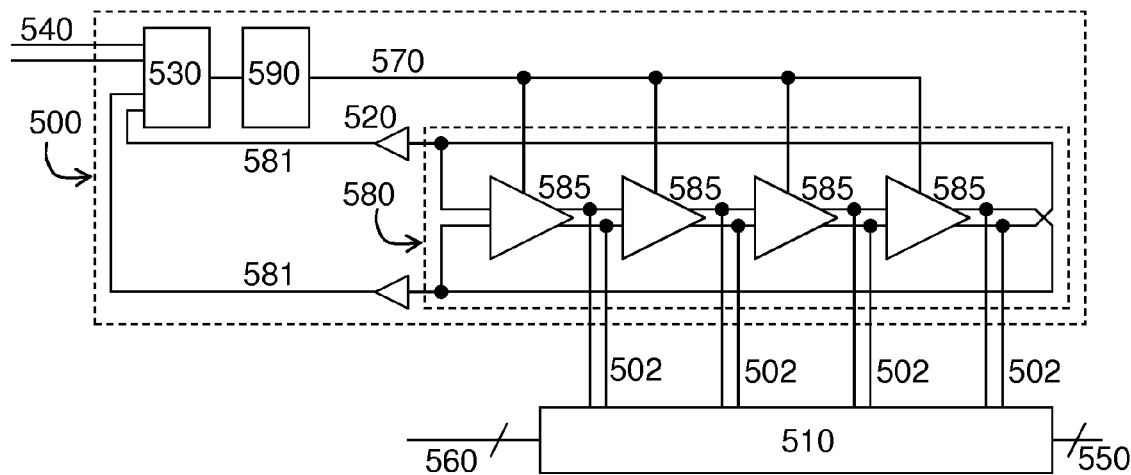
FIG. 7 shows a schematic block diagram of a modulator according to one aspect of the disclosure.

FIG. 7 shows a schematic block diagram of a modulator according to one aspect of the disclosure. In this embodiment, the modulator, which produces drive signals 201, 202, 203 and 204 in FIG. 2 or 301, 302, 303 and 304 in FIG. 3, is based on a phase locked loop (PLL) 500. A core component of the PLL 500 is a ring oscillator 580, which contains a plurality of delay elements 585. These delay elements 585 can be differential as shown in FIG. 7 or single ended. They are connected in a loop to establish an oscillation. A control signal 570 controls the frequency of oscillation. This control signal can be a voltage signal, a current signal, a digital signal or a combination of the three. A phase frequency detector 530 compares the phase and/or frequency of the oscillator signal 581 to a reference clock signal 540. Depending on the phase and/or frequency error, an analog or digital loop filter 590 creates the control signal 570. The multiple phase signals 502 of the ring oscillator 580 are fed to selection logic 510. Depending on select signals 560, phase signals 502 are used to create the modulation signals 550.

Figure 8:
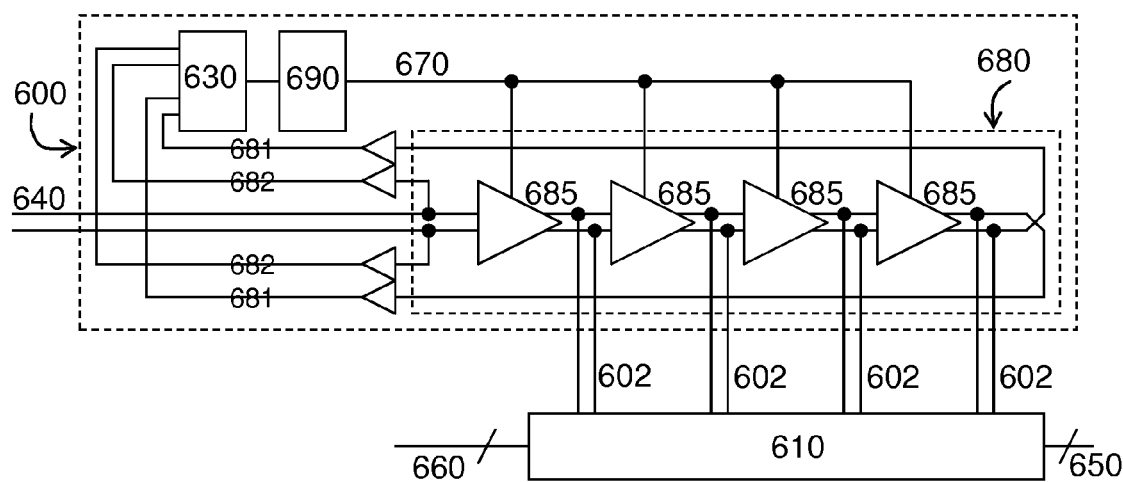
FIG. 8 shows a schematic block diagram of a modulator according to another aspect of the disclosure.

FIG. 8 shows a schematic block diagram of a modulator according to another aspect of the disclosure. In this embodiment, the modulator, which produces drive signals 201, 202, 203 and 204 in FIG. 2 or 301, 302, 303 and 304 in FIG. 3, is based on a delay locked loop (DLL) 600. A core component of the DLL 600 is a delay line 680, which contains a plurality of delay elements 685. These delay elements can be differential as shown in FIG. 8 or single ended. Their input is driven by a reference clock 640. A control signal 670 controls the delay per delay element 685. This control signal can be a voltage signal, a current signal, a digital signal or a combination of the three. A phase detector 630 compares the phase of the delay line output signal 681 to signal 682 closer to the input of the delay line. Depending on the phase error, a control signal 670 is generated. This may be an analog or digital loop filter 690. The multiple phase signals 602 of the delay line 680 are fed to selection logic 610. Depending on select signals 660, phase signals 602 are used to create the modulation signals 650.

Figure 9:
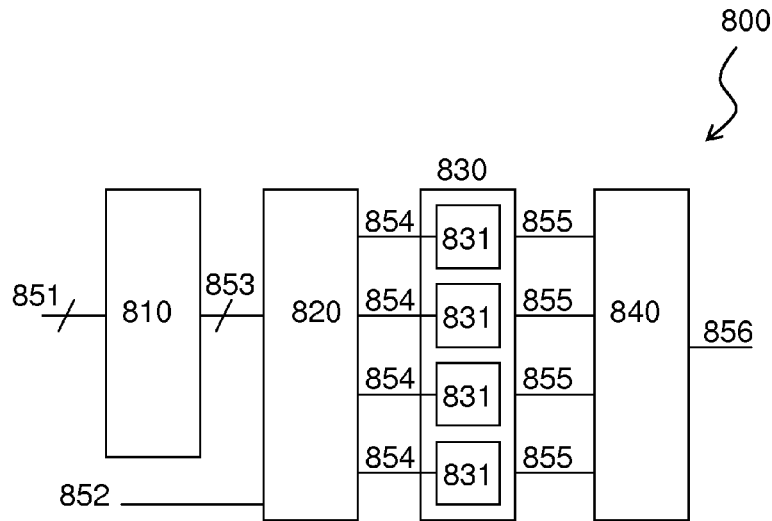
FIG. 9 shows a circuit arrangement of a signal processing element, a modulator, an array of switch-mode amplifiers and a load modulating power combiner according to one aspect of the disclosure.

FIG. 9 shows an arrangement of a signal processing element 810, a modulator 820, an array 830 of switch-mode amplifiers 831 and a load modulating power combiner 840 according to one aspect of the disclosure. Input signal 851 can be digital or analog. Input signal 851 can be in Cartesian coordinates (real and imaginary part) or polar coordinates (phase and amplitude). The processing element calculates select signals 853 from input signal 851. The modulator 820 creates modulation signals 854 based on select signals 853. The modulator 820 can for example be realized as described in FIG. 7 or 8. The modulation signals 854 modulate the array 830 of switch-mode amplifiers 831. Output signals 855 of switch-mode amplifiers 831 are combined in load modulating combiner 840. Combiner 840 can for example be realized as described in FIG. 5 or 6, but other combiners are possible as well.

Figure 10:
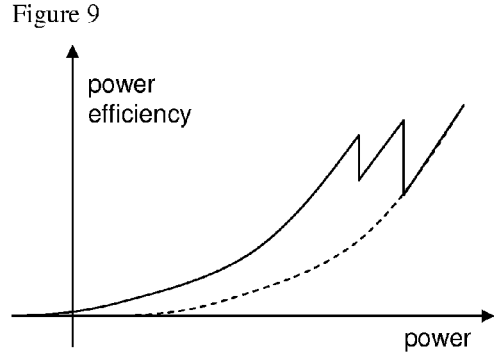
FIG. 10 shows the trend of power efficiency versus output power valid for some aspects of the disclosure.

FIG. 10 shows the trend of power efficiency versus output power of a single switch-mode amplifier (dashed line) and multiple switch-mode amplifiers according some aspects of this disclosure (solid line). It is seen that the efficiency is improved in the low power region, where some switch-mode amplifiers are not active. The discontinuity marks the power levels at which additional amplifiers are activated/de-activated. For comparison, the dashed line indicates efficiency with all amplifiers being active at all power levels.

Figure 11:
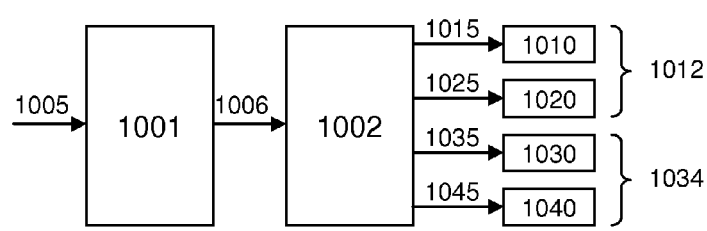
FIG. 11 shows a block diagram of a circuit arrangement according to one aspects of the disclosure.

FIG. 11 shows a circuit arrangement according to another aspect of the invention. It comprises a signal analyzer 1001 configured to determine an instantaneous power level or amplitude level of an input signal 1005. The determined instantaneous power level or amplitude level determines an instantaneous number of switch-mode amplifiers to be used for jointly amplifying the input signal; The information on how many switch mode amplifiers are instantaneously used is contained in signal 1006, which is passed to a pulse generator 1002. The pulse generator 1002 is configured to generate drive pulses according to an out-phasing modulation scheme for the determined instantaneous number of switch-mode amplifiers selected from at least three switch-mode amplifiers 1010, 1020, 1030, 1040. The number of switch-mode amplifiers 1010, 1020, 1030, 1040 is chosen arbitrarily to be four in FIG. 11. It can be smaller or larger than four, and it can be even or odd. Drive pulses to switch-mode amplifiers 1010, 1020, 1030, 1040 are contained in drive signals 1015, 1025, 1035, 1045. These drive signals 1015, 1025, 1035, 1045 can be analog or digital. The pulse generator 1002 can be configured to select the switch-mode amplifiers for the instantaneous out-phasing modulation scheme on the basis of at least one of a random selection scheme, a periodic selection scheme, a round-robin selection scheme, and an alternating selection scheme. Using such modulation schemes may help to improve the output spectrum of the amplifiers in presence of mismatch between switch-mode amplifiers 1010, 1020, 1030, 1040. This method is sometimes referred to as "dynamic element matching".

The switch-mode amplifiers 1010, 1020, 1030, 1040 may be organized in pairs 1012, 1034. Preferably, at least one pair 1012 or 1034, when selected by the pulse generator 1002, is at least temporarily driven by the drive pulses according to an out-phasing modulation scheme. In this case, the pulse generator 1002 is configured to generate the drive pulses according to an out-phasing modulation scheme for at least this one pair 1012 or 1034, and—depending on the instantaneous number of switch mode amplifiers to be used—possibly other drive signals for the remaining pairs 1034 or 1012 of switch mode amplifiers. These other signals may be temporarily periodic pulses, in-phase with the instantaneous required combined output signal, as shown for signals 201, 202 in FIG. 2 at high power levels.

Figure 12:
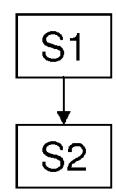
FIG. 12 shows a method according to the disclosure.

FIG. 12 shows a method for controlling at least three switch-mode amplifiers for jointly amplifying an input signal. In a first step S1, an instantaneous power level or amplitude level of an input signal to be amplified is determined. The determined instantaneous power level or amplitude level determines an instantaneous number of switch-mode amplifiers to be used for jointly amplifying the input signal. In a second step S2, the drive pulses for the determined instantaneous number of switch-mode amplifiers selected from at least three switch-mode amplifiers are generated according to an out-phasing modulation scheme.

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a central processing unit ("CPU"), micro processor, micro controller, field programmable array (FPGA), digital signal processor, processor core, system on chip ("SOC"), an application specific integrated circuit (ASIC), a chip set comprising more than one integrated circuit, a multi-chip module, or any other device), implementations may also be embodied in software (e.g. computer readable code, program code, and/or instructions disposed in any form, such as source, object or machine language) disposed for example in a computer useable (e.g. readable) medium configured to store the software. Such software can enable, for example, the function, fabrication, modeling, simulation, description and/or testing of the apparatus and methods describe herein. For example, this can be accomplished through the use of general program languages (e.g., C, C++), hardware description languages (HDL) including Verilog HDL, VHDL, a layout description language (GDS, GDS II, Gerber, . . . ), a circuit description language (Spice) and so on, or other available programs. Such software can be disposed in any known computer useable medium such as semiconductor, magnetic disc, or optical disc (e.g., CD-ROM, DVD-ROM, etc.). The software can also be disposed as a computer data signal embodied in a computer useable (e.g. readable) transmission medium (e.g., carrier wave or any other medium including digital, optical, analogue-based medium). Embodiments of the present invention may include methods of providing the apparatus described herein by providing software describing the apparatus and subsequently transmitting the software as a computer data signal over a communication network including the internet and intranets.

It is understood that the apparatus and method describe herein may be included in a semiconductor intellectual property core, such as a micro processor core (e.g., embodied in HDL), an application specific integrated circuit (ASIC), and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A circuit arrangement comprising
a power combiner for combining the output power of switch-mode amplifiers and
at least four switch-mode amplifiers, wherein
at any time, at least one pair of switch-mode amplifiers performs RF out-phasing, and
the number of pairs of switch-mode amplifiers being active is dynamically adapted to the required RF output power.

2. A circuit arrangement for generating the drive signals for at least four radio frequency switch-mode amplifiers, wherein
at any time, at least one pair of switch-mode amplifiers performs RF out-phasing, and
the number of pairs of switch-mode amplifiers is being active is dynamically adapted to the required RF output power.

3. The circuit arrangement of claim 2, comprising a timing unit based on any of:
at least one DLL
at least one ring-oscillator
a plurality of analog PLLs
a plurality of digital PLLs.

4. Method for generating the drive signals for at least four radio frequency switch-mode amplifiers, wherein
at any time, at least one pair of switch-mode amplifiers performs RF out-phasing, and
the number of pairs of switch-mode amplifiers being active is dynamically adapted to the required RF output power.

5. The method of claim 4 wherein switching events are dynamically mapped to switch-mode amplifiers.

6. Circuit arrangement of claim 1, wherein the power of switch-mode amplifiers is combined using transformers.

7. Circuit arrangement of claim 1 wherein the power combiner for combining the output power of switch-mode amplifiers comprises
at least one shunt capacitor
at least one series inductive circuit element per switch-mode amplifier, connected between the switch-mode amplifier's output and the shunt capacitor.

\* \* \* \* \*